United States Patent
Chi et al.

(10) Patent No.: US 9,006,066 B2
(45) Date of Patent: Apr. 14, 2015

(54) FINFET WITH ACTIVE REGION SHAPED STRUCTURES AND CHANNEL SEPARATION

(71) Applicant: GLOBALFOUNDRIES, Inc., Grand Cayman (KY)

(72) Inventors: Min-Hwa Chi, Malta, NY (US); Hoong Shing Wong, Clifton Park, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 20 days.

(21) Appl. No.: 13/871,357

(22) Filed: Apr. 26, 2013

(65) Prior Publication Data

US 2014/0319615 A1    Oct. 30, 2014

(51) Int. Cl.
*H01L 29/66* (2006.01)
*H01L 29/78* (2006.01)

(52) U.S. Cl.
CPC ........ *H01L 29/66795* (2013.01); *H01L 29/785* (2013.01)

(58) Field of Classification Search
CPC .............................. H01L 29/78; H01L 21/336
USPC .......... 257/288, 347, 365, E29.255, E21.409; 438/294, 151, 153, 157, 197
See application file for complete search history.

(56) References Cited

U.S. PATENT DOCUMENTS

| | | | |
|---|---|---|---|
| 3,721,593 A | 3/1973 | Hays et al. | |
| 6,911,697 B1 * | 6/2005 | Wang et al. | 257/347 |
| 7,351,622 B2 * | 4/2008 | Buh et al. | 438/157 |
| 7,365,401 B2 * | 4/2008 | Anderson et al. | 257/401 |
| 7,384,830 B2 * | 6/2008 | Cohen | 438/153 |
| 7,560,358 B1 | 7/2009 | Kim et al. | |
| 7,803,684 B2 | 9/2010 | Jang et al. | |
| 8,241,970 B2 | 8/2012 | Cohen et al. | |
| 8,264,021 B2 | 9/2012 | Lai et al. | |
| 8,278,179 B2 | 10/2012 | Lin et al. | |
| 8,294,246 B2 | 10/2012 | Lee et al. | |
| 2011/0079829 A1 * | 4/2011 | Lai et al. | 257/288 |

OTHER PUBLICATIONS

Pretet, et al., "Silicon-on-Nothing MOSFETs: Performance, Short-Channel Effects, and Backgate Coupling," IEEE Transactions on Electron Devices, vol. 51, No. 2, Feb. 2004, pp. 240-245.

(Continued)

*Primary Examiner* — Thao X Le
*Assistant Examiner* — Sheng Zhu
(74) *Attorney, Agent, or Firm* — Wayne F. Reinke, Esq.; Heslin Rothenberg Farley & Mesiti P.C.

(57) ABSTRACT

A semiconductor structure in fabrication includes a n-FinFET and p-FinFET. Stress inducing materials such as silicon and silicon germanium are epitaxially grown into naturally diamond-shaped structures atop the silicon fins of the n-FinFET and p-FinFET areas. The diamond structures act as the source, drain and channel between the source and drain. The diamond structures of the channel are selectively separated from the fin while retaining the fin connections of the diamond-shaped growth of the source and the drain. Further fabrication to complete the structure may then proceed.

10 Claims, 5 Drawing Sheets

(56) References Cited

OTHER PUBLICATIONS

Monfray, et al., "SON (Silicon-On-Nothing) technological CMOS Platform: Highly performant devices and SRAM cells," IEEE, 2004, pp. IEDM 04-635 through 638-IEDM 04 (also numbered 27.3.1 through 27.3.4).

Kim, et al., "Silicon on Replacement Insulator (SRI) Floating Body Cell (FBC) Memory," 2010 IEEE 978-1-4244-7641-1/10, 2010 Symposium on VLSI Technology Digest of Technical Papers, pp. 165-166.

* cited by examiner

FINFET WITH ACTIVE REGION SHAPED STRUCTURES AND CHANNEL SEPARATION

BACKGROUND OF THE INVENTION

1. Technical Field

The present invention generally relates to semiconductor devices and methods of fabricating the same. More particularly, the present invention relates to fabricating shaped semiconductor structures on fins of FinFETs, and selectively separating the shaped structures from the channel area of the fins.

2. Background Information

In microelectronic integrated circuit fabrication, the bulk silicon wafers where the active regions in the devices are kept in contact with the substrates, have several disadvantages such as increased leakage current and junction capacitance, increased short-channel effects, reduced resistance to effects of radiation and heat. So, in order to overcome these issues and improve the device performance, silicon-on-nothing (SON) devices have been fabricated such that the thin silicon layer is separated from the substrate by an extended void plane or air-gap. In a typical SON process, a silicon germanium (SiGe) layer is deposited on a semiconductor wafer surface by selective epitaxial growth, a silicon bridge is formed above the silicon germanium layer, and then the silicon germanium layer is selectively etched away, leaving an air gap.

To further improve the device performance, silicon-on-replacement-insulator (SRI) devices have been fabricated where the entire transistor is built above the air gap with adjacent silicon areas anchored to the bulk substrate. The air-gap, as formed similarly as SON by SiGe deposition and later etched away, is further filled with conformal oxide to complete the silicon-on-replacement-insulator (SRI) technology. However, it has not been practical to extend the silicon-on-nothing (SON) and silicon-on-replacement-insulator (SRI) processes to develop a semiconductor device utilizing a silicon germanium-on-nothing (SiGeON) or silicon germanium-on-oxide technology to further improve the device performance.

Thus there is a need to improve a method to fabricate a semiconductor device utilizing silicon germanium-on-nothing or silicon germanium-on-oxide technology.

SUMMARY OF THE INVENTION

The shortcomings of the prior art are overcome and additional advantages are provided through the provision, in one aspect, of a method of fabricating a semiconductor device. The method includes providing an intermediate semiconductor structure, including a semiconductor substrate, and at least one fin coupled to the semiconductor substrate. The method further includes selectively growing a plurality of shaped structures on a top surface of the at least one fin, the plurality of naturally shaped structures including a source, a drain and a channel between the source and the drain, and creating a physical separation between the plurality of naturally shaped structures of the channel and the corresponding fin therebelow.

In accordance with another aspect, a transistor is provided including a semiconductor substrate, and at least one fin, each fin including an active region having a source, a drain and a channel between the source and the drain. The active region of at least one fin includes a plurality of naturally shaped semiconductor structures. The plurality of naturally shaped semiconductor structures of the channel of the active region are separated from the corresponding fin therebelow, while the plurality of naturally shaped semiconductor structures of the source and drain areas are connected to the corresponding fin therebelow.

These, and other objects, features and advantages of this invention will become apparent from the following detailed description of the various aspects of the invention taken in conjunction with the accompanying drawings.

DETAILED DESCRIPTION OF THE INVENTION

Aspects of the present invention and certain features, advantages, and details thereof, are explained more fully below with reference to the non-limiting examples illustrated in the accompanying drawings. Descriptions of well-known materials, fabrication tools, processing techniques, etc., are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

Approximating language, as used herein throughout the specification and claims, may be applied to modify any quantitative representation that could permissibly vary without resulting in a change in the basic function to which it is related. Accordingly, a value modified by a term or terms, such as "about," is not limited to the precise value specified. In some instances, the approximating language may correspond to the precision of an instrument for measuring the value.

The terminology used herein is for the purpose of describing particular examples only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include (and any form of include, such as "includes" and "including"), and "contain" (and any form of contain, such as "contains" and "containing") are open-ended linking verbs. As a result, a method or device that "comprises," "has," "includes" or "contains" one or more steps or elements possesses those one or more steps or elements, but is not limited to possessing only those one or more steps or elements. Likewise, a step of a method or an element of a device that "comprises," "has," "includes" or "contains" one or more features possesses those one or more features, but is not limited to possessing only those one or more features. Furthermore, a device or structure that is configured in a certain way is configured in at least that way, but may also be configured in ways that are not listed.

As used herein, the terms "may" and "may be" indicate a possibility of an occurrence within a set of circumstances; a possession of a specified property, characteristic or function; and/or qualify another verb by expressing one or more of an ability, capability, or possibility associated with the qualified verb. Accordingly, usage of "may" and "may be" indicates that a modified term is apparently appropriate, capable, or suitable for an indicated capacity, function, or usage, while taking into account that in some circumstances the modified term may sometimes not be appropriate, capable or suitable. For example, in some circumstances, an event or capacity can be expected, while in other circumstances the event or capacity cannot occur—this distinction is captured by the terms "may" and "may be."

Reference is made below to the drawings, which are not drawn to scale for ease of understanding, wherein the same reference numbers are used throughout different figures to designate the same or similar components.

Figure 1:
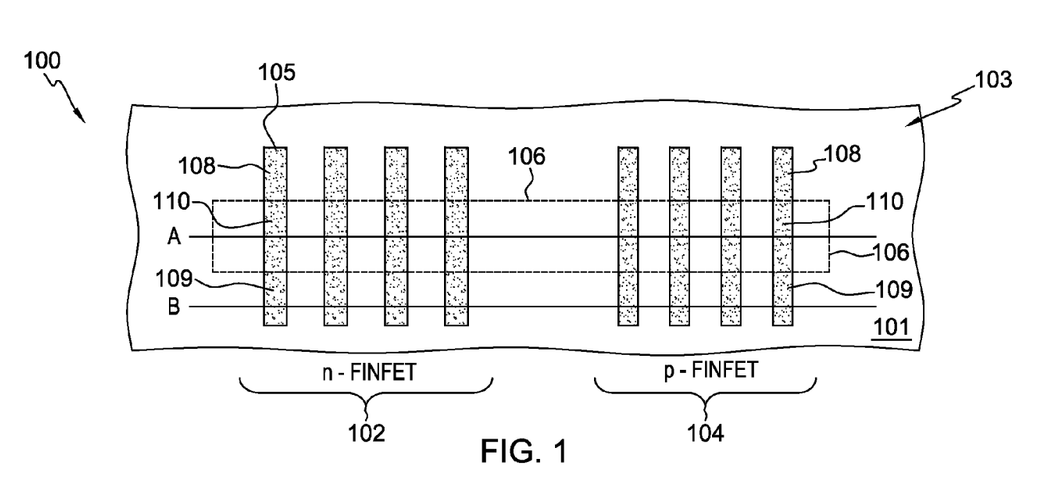
FIG. 1 is a top view of one example of an intermediate semiconductor structure including an n-type FinFET and a p-type FinFET, each having multiple fins, in accordance with one or more aspects of the present invention.

FIG. 1 schematically illustrates a top view of a FinFET device 100, including a substrate 101 along with a fin structure 103 disposed above the semiconductor substrate, at an early stage of semiconductor fabrication. As one skilled in the art will know, a FinFET is a Field Effect Transistor having the source/drain/channel region situated above the substrate in one or more raised structures roughly resembling fins in some designs. A FinFET is typically on the order of tens of nanometers in width and with single or multiple fins. Advantageously, the fin structure helps to control current leakage through the transistor in the off stage, and a double gate or tri-gate structure may be employed to control short channel effects.

Returning to the top view of the FinFET device 100 in FIG. 1, the semiconductor substrate may include, for example, silicon in a crystalline structure with any suitable crystallographic orientation. Suitable orientations include, for example, (100), (110) and (111) orientations. In the present example, the substrate has a planar (100) crystallographic surface orientation (referred to as (100) surface) and, where the substrate is a wafer, may further include a notch (not shown) at an edge of the wafer, along any suitable direction, such as, for example, <110> (most popular) or <100> direction. It may be noted that the crystal direction is indicated by <100>, and the crystal surface is denoted by (100) as shown). The substrate may take various different forms, for example, silicon-on-nothing (SON), silicon-on-insulator (SOI) or silicon-on-replacement insulator (SRI) substrates. The substrate may in addition or instead include various isolations, dopings and/or features, to name a few examples. For example, the substrate may include other suitable elementary semiconductors, such as germanium (Ge) in crystal; a compound semiconductor such as silicon carbide (SiC), gallium arsenic (GaAs), gallium phosphide (GaP) indium phosphide (InP), indium arsenide (InAs), and/or indium antimonide (Sb) or combinations thereof; an alloy semiconductor including GaAsP, AlInAs, AlGaAs, GaInAs, GaInP, or GaInAsP or combinations thereof. The substrate may also include isolation regions, various doped regions, other suitable features, and/or combinations thereof.

Continuing with FIG. 1, the fin structure may include one or more fins, made of any suitable material. In the present example, two types of FinFETs are included; n-type FinFETs (e.g., 102) and p-type FinFETs (e.g., 104), each including one or more silicon fins, for example, fin 105. Each fin 105 includes areas for a source 109, drain 108 and channel 110. It will be understood that the positioning of the source and drain areas could be switched. Shown in outline in order to better see the fins, is a gate 106. The gate may include, for example, polysilicon or polycrystalline silicon which, as known, may be employed to hold the gate positions for the subsequent metal gate electrodes to be formed. As illustrated later, a cross-sectional view along line A-A would be through the channel region of the fin structure, while a cross-sectional view along line B-B would be through the source or drain regions of the fin structure.

As one skilled in the art will know, where the substrate is a semiconductor wafer including an orientation notch (in <110> or <100> directions), the fins 105 may be positioned substantially parallel or perpendicular to the direction as defined by the notch (or flat) pointing to <110> or <100> direction. The gate 106 may be positioned substantially perpendicular to the direction of the fins 105 and over a portion of the top and a portion of the side surfaces of the fins 105. Further, the fin (structure) 105 may exhibit a rectangular shape with a top surface having a (100) crystallographic surface orientation and a (110) crystallographic surface for the sidewall surfaces in case the notch pointing to <110> direction. Alternatively, the crystallographic orientation of the top surface and the sidewall surfaces of the fins 105 may include a (100) surface orientation, in the case of the substrate including a notch aligned toward <100> direction. The fin structure with the most popular 'notch' pointing to <110>, is discussed in this application for simplicity.

Figure 2:
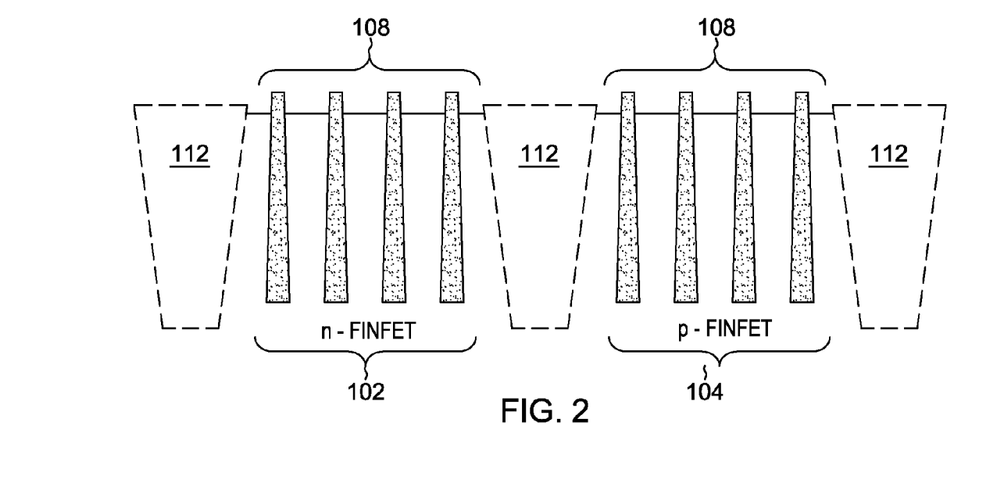
FIG. 2 is a cross-sectional view of the intermediate semiconductor structure of FIG. 1, across the channel area of the FinFETs, in accordance with one or more aspects of the present invention.

FIG. 2 schematically illustrates a cross-sectional view along either AA or BB (the views are the same at this stage before the gate 106 is formed). It may be observed that the fin structures are laterally separated by corresponding isolation regions 112, such as, for example, shallow isolation trenches (STI). The formation of isolation regions, such as shallow isolation trenches, may typically include forming a recess on the silicon substrate and filling with a dielectric film using a CVD process, such as a low pressure CVD (LPCVD), high-density CVD (HDCVD), or plasma enhanced CVD (PECVD), then performing a chemical mechanical polish (CMP) to remove the excess dielectric film filling the shallow isolation trenches. The isolation regions 112 may be filled with dielectric materials such as, silicon oxide, silicon nitride and the like. The isolation regions may be annealed at a temperature of about 900° C. to about 1100° C. After the formation of the isolation regions 112, the fin structures 105 may be revealed by performing plasma etching to recess the dielectric materials in the isolation regions. It will be understood that the selective etching results in the top surfaces of the fin structure maintaining (100) surface orientation, while the slightly sloped sidewalls of the fin structures are exposed and have nearly a (110) surface orientation (based on the popular notch along <110> direction). In one example, the isolation regions are recessed by about 10 nanometer(nm) to about 40 nm to form the active fin height of about 10 nm to about 40 nm.

Figure 3:
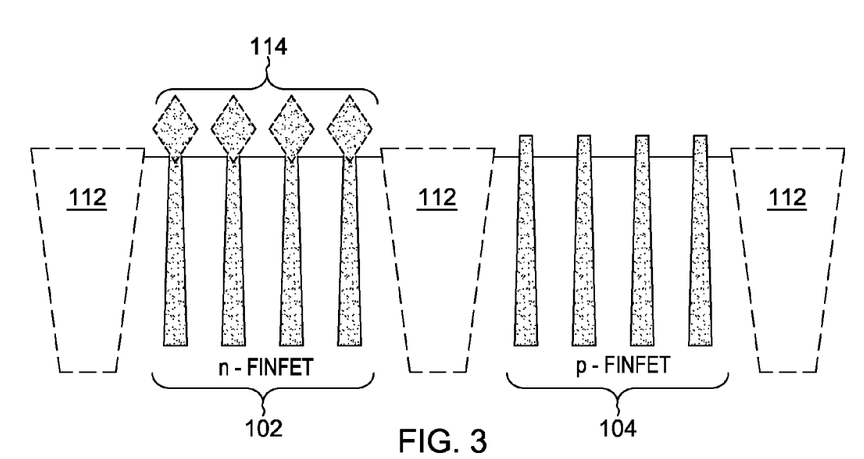
FIG. 3 depicts an example of epitaxial growth of silicon into diamond-shaped structures on the n-FinFET of FIG. 2, in accordance with one or more aspects of the present invention.
Figure 4:
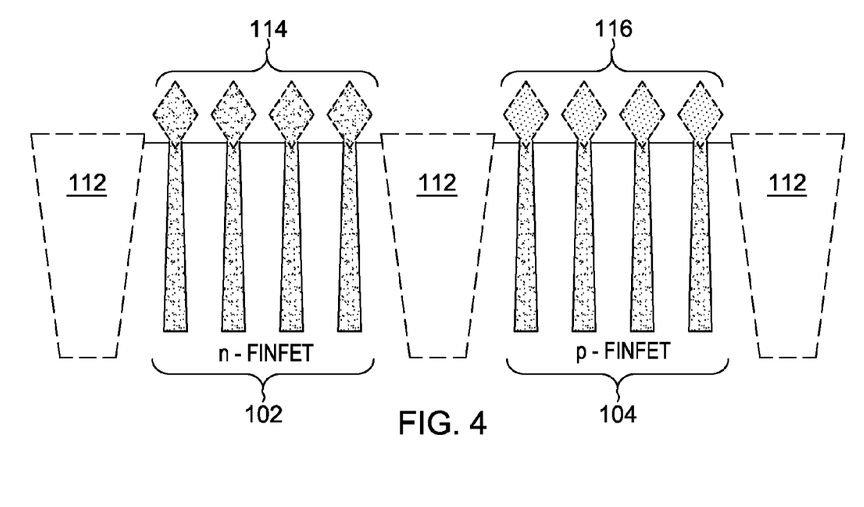
FIG. 4 depicts an example of epitaxial growth of silicon germanium into diamond-shaped structures on the p-FinFET of FIG. 3, in accordance with one or more aspects of the present invention.

After a top portion of one or more of the fins is revealed, what will become the source, drain and channel is created on the top portion. The fins 105 may further be grown with stress-inducing materials, such as, for example, epitaxial silicon materials. For example, one or more compressive stress inducing materials or one or more tensile stress inducing materials may be epitaxially grown on the fins, as depicted in FIG. 3 and FIG. 4. In one example, a tensile stress-inducing material is used, such as, for example, silicon doped with carbon (Si:C) where the atomic percentage of carbon (C) may be about 1 percent to about 3 percent, and may be epitaxially grown atop the silicon (Si) fins for n-FinFET 102, while keeping p-FinFET 104 masked with a thin oxide layer to inhibit epitaxial growth, as understood in the art (not shown). The epi growth is typically referred to as selective epi-growth (SEG).

As shown in FIG. 3, the epitaxial growth of silicon naturally forms into shaped structures (referred to as shaped structures or naturally shaped structures hereafter) such as, for example, elongated diamond shapes as in the present example. The natural shape formation is controlled by the crystallographic orientation of the (111) surface with the slowest epi growth rate.

Figure 9:
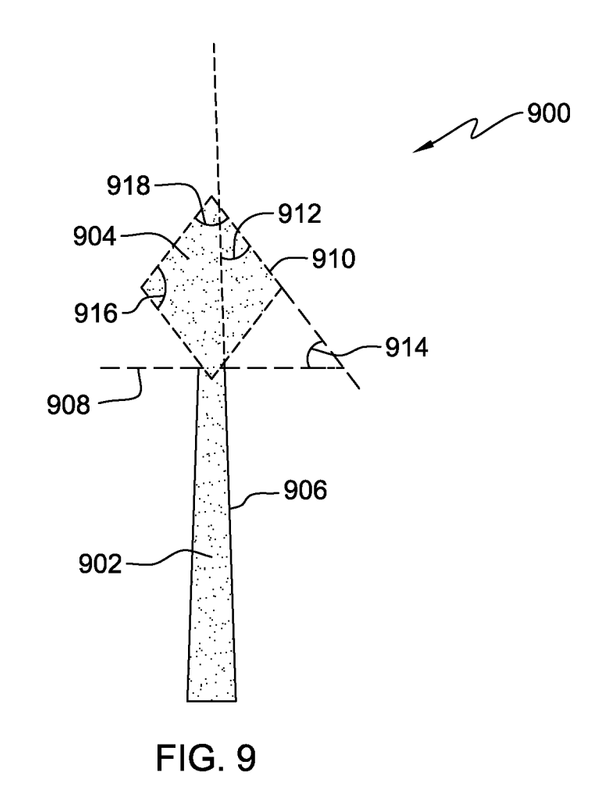
FIG. 9 is a cross-sectional view of one example of an individual fin with a diamond-shaped structure of FIG. 3, for use in identifying orientations and determining angles between the various surfaces, in accordance with one or more aspects of the present invention.

FIG. 9 is a cross-sectional view of one example of the fin structure 900 created. The fin structure includes a fin 902 and a naturally shaped structure 904 grown thereon. As one skilled in the art will know, the vertical surfaces of the fin (e.g., surface 906) have a (110) crystallographic orientation, while the horizontal top surface of the fin 908 has a (100) orientation of the substrate, and the top surface of the shaped structure 910 has a (111) orientation. As shown in FIG. 9, the angle 912 between the (111) surface 910 and (110) surface 906 is 35.3°; and the angle 914 between (111) surface 910 and (100) surface 908 is 54.7°. Therefore, it may be noted that the resultant profile of the "diamond-shaped" semiconductor structures have inner side angles 916 of about 109.4° (2× of 54.7°) and an inner top angle 918 of about 70.6°, (2× of 35.3°) respectively.

The term "tensile stress inducing material" denotes a material layer having an intrinsic tensile stress (or strain), in which the intrinsic tensile stress produces a tensile stress in one or more adjacent materials. It may be noted that the epitaxial growth of silicon occurs on a crystalline silicon surface and not on an amorphous oxide surface, in a process commonly referred to as selective epitaxial growth (SEG). It may be realized via various methods, such as, for example, chemical vapor deposition (CVD), reduced pressure CVD (RPCVD) or other applicable methods. The selective epitaxial growth starts when at least one semiconductor source gas is injected into the reaction chamber. In one example, the semiconductor source gas may be a silicon containing source gas, such as, silane (SiH$_4$) gas, a disilane (Si$_2$H$_6$) gas, a dichlorosilane (SiH$_2$Cl$_2$) gas, a SiHCl$_3$ gas and a SiCl$_4$ gas. In another example, germanium or carbon containing precursor may be mixed with the above gases to form SiGe or SiC crystal. Furthermore, III-V and II-VI compounds can also be grown on a crystalline silicon surface by using gases containing respective elements. Further, an HF-dip may be performed to remove the thin oxide and expose the silicon (Si) surface before the start of the selective epitaxial growth. It may be understood that the lithographic masking steps may be performed to sequentially open a specific area and expose the fins 105 by HF-dip and followed by the selective epitaxial growth.

It is observed that due to different growth rates on different crystal surface planes or orientations, different shapes may be formed. For example, the growth rate on the silicon (Si) surfaces having (111) orientations is slower than that on other planes such as (110) or (100) planes. Accordingly, the resultant diamond shape after SEG results from the slowest epi growth rate on the (111) surface. During the epitaxial growth, a thin silicon layer may begin to form around the (110) surface orientation of the fins, with the growth sticking out of the sidewall surface. As the growth continues, it may be limited by the (111) surface orientation, gradually resulting in a diamond shape with characteristic inner angle on side 916 and top angle 918 of about 109.4° and about 70.6°, respectively, as referenced in FIG. 9. Note that the fin tops are therefore "diamond shaped," versus conventional "rectangular" shape (before SEG), with advantages of a greater surface area and volume in the active region, the flexibility of a multi-layer fin structure (e.g., SiGe diamonds on Si fins), and built-in fin stress materials as compared to the conventional surface.

In another example, a compressive stress inducing material, such as silicon germanium (SiGe with Ge including an atomic percentage of about 10 to about 50 percent), may be epitaxially grown atop the silicon (Si) fins 116 of the p-FinFET 104 while keeping the n-FinFET masked (by a thin oxide layer) in some conventional manner (not shown).

The term "compressive stress inducing material" denotes a material having an intrinsic compressive stress, in which the intrinsic compressive stress produces compressive stress in one or more adjacent materials. The epitaxial growth may be realized using selective epitaxial growth via various methods, such as, for example, chemical vapor deposition (CVD), reduced pressure CVD (RPCVD) or other applicable methods. As in the above case, the epitaxial growth may be initiated using a silicon germanium source gas, which may include an adjustable ratio of silicon containing source gas and the germanium containing source gas so as to adjust the desirable germanium content from about 10% to about 50% (with compressive stress increasing with Ge %). The semiconductor source gas may instead be, for example, one of the more advanced gases from the family of germyl-silanes, such as H$_3$GeSiH$_3$, (H$_3$Ge)$_2$SiH$_2$, (H$_3$Ge)$_3$SiH, or (H$_3$Ge)$_4$Si, or may include a carbon source gas for the growth of SiC and SiGeC. Similar to the above case, diamond-shaped structures are formed on the fins as a result of the slow growth rates of (111) surface orientation. The amount of epitaxial growth for these fin extensions is controlled so that the extensions are separated with enough spacing of about 5 nm from adjacent fins. It may be noted that the separation of the fin extensions may preserve a large level of stress in the fins, as the stress decreases if the fin extensions are connected together with adjacent fins. The size of the diamond shape may be controlled by controlling process parameters of SEG, such as chamber temperature, time of growth, and pressure.

The fabrication process may be continued further, for example, with a conventional replacement metal gate process, also referred to as "gate-last" process. Although not critical to the invention, sacrificial material of the gate 106 in FIG. 1 may be removed during the subsequent processing steps, and the "diamond" shaped structures of the channel may be exposed. It may be noted that all other areas of source or drain portions of fins are protected by the "inter metal dielectric" (IMD), such as, for example, Si-oxide. Subsequently, the diamond shaped structures of the channel area may be separated from the fin, while retaining the fin connections in the source and drain. The separation between the diamond shaped growth of the channel and the corresponding fin below may be accomplished as subsequently explained in greater detail.

Figure 5:
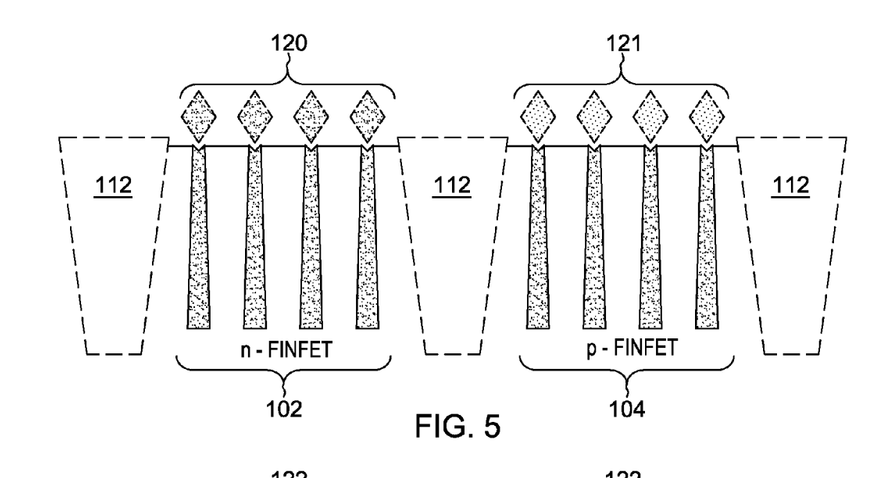
FIG. 5 depicts an example of the structure of FIG. 4 after separation of the diamond-shaped structures from their corresponding fins in the channel area of the FinFETs, in accordance with one or more aspects of the present invention.
Figure 6:
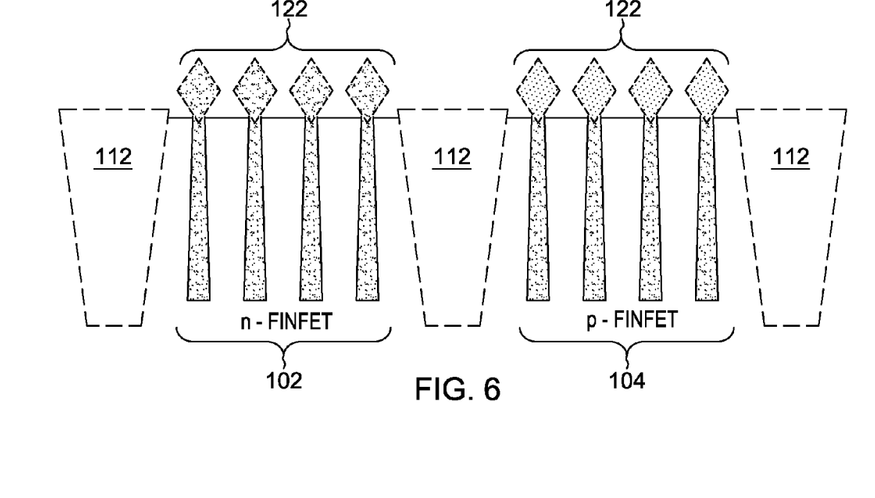
FIG. 6 is a cross-sectional view of one example of the intermediate structure of FIG. 4 across the source areas of the FinFETs, in accordance with one or more aspects of the present invention.

FIG. 5 is a cross-sectional view across the channel areas of the FinFETs along line AA (see FIG. 1), after separating or creating a gap between the diamond structures 120, 121 and the corresponding fin, while FIG. 6 is a cross-sectional view across the source areas of the FinFETs along line BB. Note that a cross-sectional view across the drain areas would look similar to that of the source areas. The diamond-shaped stress inducing epitaxial growth of silicon and silicon germanium from the channel area of the silicon fins may be selectively separated or created gap from the bottom fins (120 and 121 FIG. 5), while retaining the fin connections of the diamond-shaped growth (122, FIG. 6) in the source and the drain areas of the fins. The selective etching may be performed sequentially over the n-FinFET 102 and the p-FinFET 104 by sequentially masking the n-FinFET, while exposing the p-FinFET, and likewise masking the p-FinFET area while exposing the n-FinFET area (for the consideration of etching rate differences in case of different stress inducing materials used on n-type and p-type FinFET).

Figure 7:
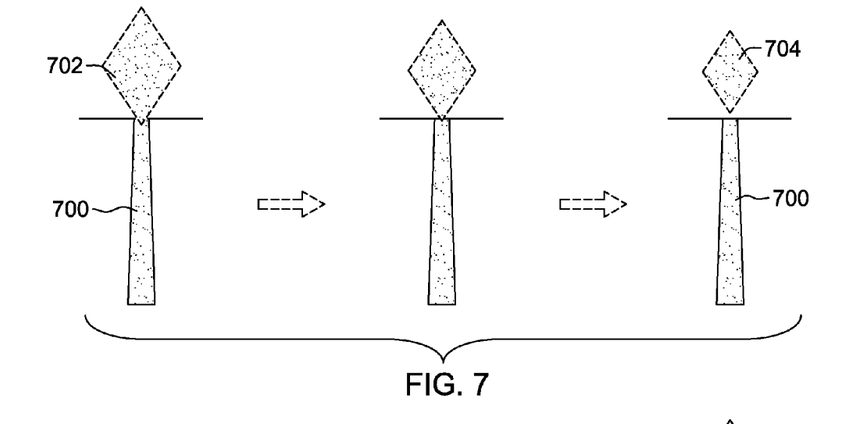
FIG. 7 graphically depicts one example of separation of the diamond-shaped structures from their corresponding fins by isotropic dry or wet etching, in accordance with one or more aspects of the present invention.

The selective removal of the epitaxial growth of silicon and silicon germanium from the channel area may be performed using an isotropic dry or wet etching, as shown in FIG. 7. In one example, the isotropic dry etching may take the form of, for example, isotropic plasma etching or reactive ion etching (RIE). In another example, the isotropic wet etching may also be performed using etching solutions such as, for example, HF: Nitric: Acetic solution (also known as HNA etch). The isotropic dry etching or the isotropic wet etching would have no preference to the surface orientation of the region to be etched. As a consequence, the fin connection of the diamond-shaped growth in the channel area is etched narrower and finally separated from the channel area, effectively resulting in a reduced size of the diamond-shape structures. An example of the progression of the isotropic dry etching is shown in FIG. 7, where diamond-shaped structure 700 on channel fin 702 is gradually reduced in size to create a separation with the fin.

Figure 8:
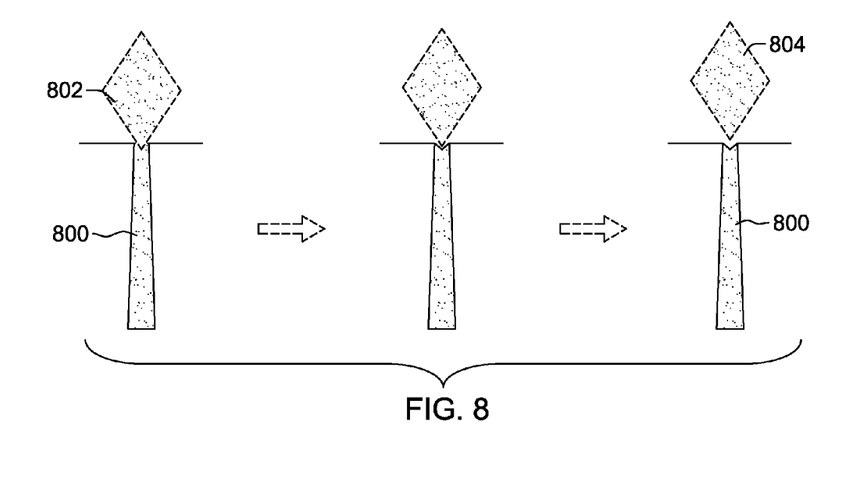
FIG. 8 graphically depicts one example of separation of the diamond-shaped structures from their corresponding fins by anisotropic wet etching, in accordance with one or more aspects of the present invention.

Alternately, as shown in FIG. 8, an oxide recess may be firstly performed by using HF dip to expose the (100) or (110) crystal surface orientation at the base of the diamond-shaped fin tops. The diamond-shaped fin tops may be separated from the fin body portion by performing a highly selective anisotropic wet etching using hydroxide containing chemical wet etchants. Some examples of the hydroxide-containing etch chemistry include tetramethylammonium hydroxide (TMAH), ammonium hydroxide (NH$_4$OH), potassium hydroxide (KOH) and lithium hydroxide (LiOH). Since the etching rate of Si (100) and (110) surface orientation is about 10 to about 100 times larger than that of (111) surface orientation, hydroxide-containing etch chemistries are one example of a family of etch chemistries that may be selective to the (111) surface orientation of the diamond-shaped epitaxial growth of silicon and silicon germanium surfaces. As a consequence, the base of the diamond shape is completely separated away, and a V-shape trench may be formed on the top of the fin (as a result of the slowest etch rate of (111) surface). The gap is nearly the depth of oxide recess before wet etching as the wet anisotropic process is in a self-stopping manner on the (111) orientation surface. An example of the progression of the anisotropic wet etching is shown in FIG. 8, where diamond-shaped channel fin 802 is separated from the fin body 800 to create a diamond shaped channel 804. The fin channel on "nothing" or on "oxide" is thus formed for FinFET with advantages of significantly low leakage and high performance of the final resulted FinFET (as if on SOI substrate). As n-type and p-type FinFET may prefer different channel materials, for example, Si:C and SiGe with tensile and compressive stress respectively their wet etching rate may be significantly different. Then, the process for separating the diamond shape of fin tops for n-type and p-type FinFET shall be performed in sequential manner by using masking steps and different etch times.

The semiconductor fabrication process may be continued further, for example, with a conventional replacement metal gate process to complete the FinFETs. While several aspects of the present invention have been described and depicted herein, alternative aspects may be effected by those skilled in the art to accomplish the same objectives. Accordingly, it is intended by the appended claims to cover all such alternative aspects as fall within the true spirit and scope of the invention.

The invention claimed is:

1. A method, comprising: providing an intermediate semiconductor structure, comprising: a semiconductor substrate; at least one fin coupled to the semiconductor substrate; selectively growing a plurality of naturally shaped structures on a top surface of the at least one fin, the plurality of naturally shaped structures comprising a source, a drain and a channel between the source and the drain; and creating a physical separation between the plurality of naturally shaped structures of the channel and the corresponding fin therebelow, wherein the creating comprises at least one of recessing the shaped structures of the channel and recessing the corresponding fin therebelow.

2. The method of claim 1, wherein at least one of the at least one fin comprises n-type silicon, wherein the plurality of naturally shaped semiconductor structures comprise silicon, and wherein the plurality of naturally shaped structures have a diamond shape.

3. The method of claim 1, wherein at least one of the at least one fin comprises p-type silicon, wherein the plurality of naturally shaped structures comprise germanium, and wherein the plurality of naturally shaped structures have a diamond shape.

4. The method of claim 3, wherein the plurality of diamond-shaped structures comprise silicon germanium.

5. The method of claim 1, wherein selectively growing comprises selectively epitaxially growing the plurality of naturally shaped structures.

6. The method of claim 1, wherein creating the separation comprises one of isotropic dry etching and isotropic wet etching.

7. The method of claim 1, wherein creating the separation comprises etching the plurality of naturally shaped structures in the channel.

8. The method of claim 1, wherein creating the separation comprises etching a portion of the at least one fin in contact with the plurality of naturally shaped structures in the channel.

9. The method of claim 8, wherein creating the separation comprises:
    etching to expose the portion of the at least one fin in contact with the plurality of shaped structures in the channel; and
    anisotropically etching the exposed portion until a desired separation is achieved.

10. A method, comprising: providing an intermediate semiconductor structure, comprising: a semiconductor substrate; at least one fin coupled to the semiconductor substrate; selectively growing a plurality of naturally shaped structures on a top surface of the at least one fin, the plurality of naturally shaped structures comprising a source, a drain and a channel between the source and the drain; and creating a physical separation between the plurality of naturally shaped structures of the channel and the corresponding fin therebelow, while the plurality of naturally shaped structtu'es of the source and drain are left connected to the corresponding fin therebelow, wherein the creating comprises at least one of recessing the shaped structures of the channel and recessing the corresponding fin therebelow.

* * * * *

UNITED STATES PATENT AND TRADEMARK OFFICE
CERTIFICATE OF CORRECTION

| | | |
|---|---|---|
| PATENT NO. | : 9,006,066 B2 | |
| APPLICATION NO. | : 13/871357 | |
| DATED | : April 14, 2015 | |
| INVENTOR(S) | : Chi et al. | |

It is certified that error appears in the above-identified patent and that said Letters Patent is hereby corrected as shown below:

In the Claims

Column 9, Line 8: Claim 10, Delete "structtu'es" and insert --structures--

Signed and Sealed this
Eighteenth Day of August, 2015

Michelle K. Lee
*Director of the United States Patent and Trademark Office*